(12) United States Patent
Stigwall et al.

(10) Patent No.: US 10,877,284 B2
(45) Date of Patent: Dec. 29, 2020

(54) LASER MODULE COMPRISING A MICRO-LENS ARRAY

(71) Applicant: HEXAGON TECHNOLOGY CENTER GMBH, Heerbrugg (CH)

(72) Inventors: Johan Stigwall, St. Gallen (CH); Peter Kipfer, Marbach (CH); Thomas Jensen, Rorschach (CH)

(73) Assignee: HEXAGON TECHNOLOGY CENTER GMBH, Heerbrugg (CH)

( * ) Notice: Subject to any disclaimer, the term of this patent is extended or adjusted under 35 U.S.C. 154(b) by 853 days.

(21) Appl. No.: 15/343,169

(22) Filed: Nov. 3, 2016

(65) Prior Publication Data

US 2017/0123218 A1    May 4, 2017

(30) Foreign Application Priority Data

Nov. 4, 2015    (EP) ..................................... 15192951

(51) Int. Cl.
*G02B 27/09*    (2006.01)
*G02B 3/00*    (2006.01)
(Continued)

(52) U.S. Cl.
CPC ...... *G02B 27/0961* (2013.01); *G01B 11/2518* (2013.01); *G01C 3/18* (2013.01);
(Continued)

(58) Field of Classification Search
None
See application file for complete search history.

(56) References Cited

U.S. PATENT DOCUMENTS 5,775,799 A * 7/1998 Forkner .................. F21V 5/008
362/268
5,963,326 A * 10/1999 Masao ...................... G01J 4/00
356/364

(Continued)

FOREIGN PATENT DOCUMENTS

DE    10 2004 026 090 A1    12/2005
DE    10 2008 033 358 A1    2/2009
(Continued)

OTHER PUBLICATIONS

European Search Report dated May 17, 2016 as received in Application No. 15192951.
(Continued)

*Primary Examiner* — Hovhannes Baghdasaryan
(74) *Attorney, Agent, or Firm* — Maschoff Brennan

(57) ABSTRACT

Light emitting unit, in particular of or for a triangulation-based distance measuring device, for providing defined measuring light, in particular laser light, is disclosed. The light emitting unit comprising a light source for emitting light, in particular a laser light source for emitting laser light, and a beam forming assembly for shaping the light by affecting propagation of the light emitted by the light source, wherein the beam forming assembly is arranged and designed so that measuring light is provided in form of a light line having a midpoint and two opposite ends. The beam forming assembly comprises at least one micro-lens array, the at least one micro-lens array comprises a plurality of micro-lenses, wherein the micro-lenses are designed and arranged in joint manner next to each other with algebraic signs for curvatures of successive micro-lenses being opposite and so that a periodic structure is provided.

19 Claims, 6 Drawing Sheets

(51) Int. Cl.
    *G01B 11/25*   (2006.01)
    *G01C 3/18*    (2006.01)
    *G02B 27/30*   (2006.01)
    *H01S 5/00*    (2006.01)

(52) U.S. Cl.
    CPC ......... *G02B 3/005* (2013.01); *G02B 27/0927* (2013.01); *G02B 27/0966* (2013.01); *G02B 27/30* (2013.01); *H01S 5/0071* (2013.01)

(56) References Cited

U.S. PATENT DOCUMENTS

| | | | |
|---|---|---|---|
| 6,212,012 | B1 | 4/2001 | Tanaka |
| 2007/0057164 | A1* | 3/2007 | Vaughnn ............... G03F 7/7085 250/216 |
| 2008/0117531 | A1 | 5/2008 | Asper et al. |
| 2008/0198472 | A1* | 8/2008 | Yatsu .................. G02B 7/04 359/649 |
| 2010/0267163 | A1* | 10/2010 | Ran ..................... G01N 21/553 436/164 |
| 2012/0133928 | A1* | 5/2012 | Urano ................. G01N 21/9501 356/237.2 |
| 2013/0141715 | A1* | 6/2013 | Urano ................. G01N 21/9501 356/237.2 |

FOREIGN PATENT DOCUMENTS

| | | |
|---|---|---|
| FR | 2 902 532 A1 | 12/2007 |
| WO | 2007/125081 A1 | 11/2007 |
| WO | 2011/000435 A1 | 1/2011 |
| WO | 2014/109810 A1 | 7/2014 |

OTHER PUBLICATIONS

Fourier Optics (2nd version), Lv Naiguang, Beijing, China Machine Press, 2006, 4, pp. 90-93.

\* cited by examiner

LASER MODULE COMPRISING A MICRO-LENS ARRAY

FIELD

The present invention generally pertains to a device for providing a defined light line preferably for triangulation-based measurements of a surface of an object using an improved approach of light emitting.

BACKGROUND

It is common practice to inspect work pieces subsequent to production on a coordinate positioning apparatus, such as a coordinate measuring machine (CMM), in order to check for correctness of predefined object parameters, like dimensions and shape of the object. Moreover, a detection of a surface of an unknown object is of interest in many industrial applications. Such measurement typically also may be provided using a coordinate measuring machine or any other suitable type of scanning device.

In a conventional 3-D coordinate measurement machine, a probe head is supported for movement along three mutually perpendicular axes (in directions X, Y and Z). Thereby, the probe head can be guided to any arbitrary point in space of a measuring volume of the coordinate measuring machine and the object is measurable with a measurement sensor (probing unit) carried by the probe head. Such probing unit can be designed as a tactile probe or an optical sensor providing measurements of surfaces e.g. based on the principle of triangulation.

In a simple form of the machine a suitable transducer mounted parallel to each axis is able to determine the position of the probe head relative to a base of the machine and, therefore, to determine the coordinates of measurement points on the object being illuminated by the sensor. For providing movability of the probe head a typical coordinate measuring machine may comprise a frame structure on which the probe head is arranged and driving means for moving frame components of the frame structure relative to each other.

An advantage of using an optical sensor is that it is not in contact with the part and therefore does not deform it during the measurement or damage it, as may be the case with a tactile probe.

A specific advantage of using a line triangulation device in combination with a CMM for measuring a surface is the amount of distance information being received by one time step, i.e. distance values along the entire projected triangulation line can be determined and respective coordinates can be derived. Thus, by moving the sensor along a desired measuring path an object to be measured can entirely be scanned significantly faster.

Over the past 20 years, manually operated portable CMM systems, comprising typically four segments linked together with one or two rotation axes per linkage and a total of six or seven axes, have become popular for non repetitive measurement tasks on the shop floor. Line triangulation device are also used on such portable CMMs to greatly increase data capture speed.

Other portable measurement devices where triangulation units are used include optically tracked systems, either using multiple cameras to track the probe location and orientation or interferometric distance tracking devices, where the rotational axes of the probe are tracked using an additional camera.

Other applications for line triangulation sensors include fixed installations where an object is placed in front of the sensor or sensors and single line measurement(s) of the static object are made such that key features of the part can be captured in a single step without the need for expensive positioning systems.

Furthermore, a device for providing a topographic measurement of a surface can be embodied as a (hand-held) device comprising a triangulation sensor, wherein the device is guided along the surface to be measured—either manually or by a robot—and distance data are acquired by the sensor while moving the device. Additionally, the position and/or orientation of such device may continuously be determined (e.g. tracked) in a global coordinate system thus enabling a determination of absolute coordinates corresponding to the object's surface.

In general, triangulation provides a method for scanning a surface in fast and precise manner. Measuring devices working on that principle are for instance known from DE 10 2004 026 090 A1 or WO 2011/000435 A1.

In particular, a line generated by a laser unit, e.g. by moving a laser point along such line or by providing a laser fan, is generated on an object to be measured and the light reflected from the surface is detected by a camera consisting of a light sensitive image sensor (light detector) and electronics to control the image sensor and read out the image. An image of the reflected light is captured and distance information according to the contour of the detected line is derived. Based thereon, topography of the object's surface can be determined.

For triangulation measurements with high precision, an illumination and detection of respectively reflected light has to be provided which comprises a proper level of illumination and an adequate detection of the light information. For adjusting illumination so that the reflected light reaches the detector meeting its respective detection properties (e.g. signal-to-noise level and saturation limit) WO 2011/000435 A1 discloses an approach of an in-advanced illumination in order to determine a suitable illumination level for the measuring light. WO 2007/125081 A1 discloses a further approach for actively controlling the power of illuminating light in dependency upon an intensity detected by a camera.

WO 2014/109810 A1 teaches a method of manipulating light emitted by a laser source by use of one or more lenses and a filter element in order to provide a laser line being emitted with a uniform intensity across the line, i.e. by flatting a Gaussian profile of the laser. In case of using more than one lens, the problem of non-homogeneous light distribution along the laser line leads to non-reliable measuring results across the captured laser line. Such problem becomes more and more important the smaller or more compact the lenses are designed or arranged.

For visualisation of the problem mentioned, FIG. 1a shows a cross-cut through an array of lenses as known in the art. The lenses comprise a particular height h and a defined width x along the cutting direction. As can be seen the lenses are arranged with a particular periodicity. The region of interest, i.e. the source of irregularities in the produced laser line, is the contacting region 100 of two successive micro lenses. Due to manufacturing processes, burrs or other types of soiling are generated in the contacting regions 100 so that defined manipulation of light is no longer given in such areas. Such irregularities in material can also be seen in FIG. 1b which is an image in top view of a respective lens array. Problematic manufacturing areas are referenced with 100. Although, such non-homogeneously produced array is a

SUMMARY

Some embodiments of the present invention provide an improved illumination unit especially for a triangulation measuring device for enabling improved illumination of an object to be measured so that reliable, in particular homogeneous, light information is provided on the object.

Some embodiments of the present invention provide a respective illumination device having improved optical properties, in particular with view to avoiding irregularities in the illuminated area.

Some embodiments of the present invention provide a correspondingly improved measuring device providing improved measuring properties.

Laser triangulation sensors typically use a light or laser line to measure the 3D location of points along the illuminated line by observing the shift of the line using a camera positioned at a certain baseline distance and orientation from the light/laser plane.

Some embodiments of the present invention relate to the general idea of providing a device for distance measurement based on triangulation, wherein the light of the light or laser line which impinges on the object to be measured comprises a basically uniform light intensity across its linear extension without having alternating areas with varying brightness.

By that, a laser line emitted by a laser emitter and received on side of a camera comprises an improved (more homogeneous) intensity distribution over the light line which results in more accurate and precise distance measurements.

Some embodiments of the present invention relate to a light emitting unit, in particular of or for a triangulation-based distance measuring device, for providing defined measuring light, in particular laser light. The light emitting unit comprises a light source for emitting light, in particular a laser light source for emitting laser light, and a beam forming assembly for shaping the light by affecting propagation of the light emitted by the light source. The beam forming assembly is arranged and designed so that measuring light is provided in form of a light line having a midpoint and two opposite ends.

The light source may be embodied as a laser source, in particular a laser diode, or an adjusted LED, in particular comprising an aperture for emission of light having a preferred beam shape.

The beam forming assembly comprises at least one micro-lens array, the at least one micro-lens array comprises a plurality of micro-lenses, wherein the micro-lenses are designed and arranged in joint manner next to each other. The (algebraic) signs for curvatures of successive micro-lenses are opposite (alternating from micro-lens to micro-lens) and a periodic structure of the lens array is provided with defined periodicity defined by (the sizes and shapes of) at least two successive micro-lenses.

By providing a micro-lens array with above properties, i.e. with a wave-like surface profile or with a kind of sinusoidal shape, sharp edges on the micro-lens array can be avoided or be at least significantly reduced. As a result, there is less light scattered outside of the line, and the light line generated by such device is of comparatively high homogeneity regarding light distribution along the line. The light line can be projected so that no significant variations in brightness exist across the line.

In some embodiments of the present invention the micro-lens array is embodied as a cylindrical micro-lens array having a plurality of cylindrical micro-lenses as micro-lenses arranged next to each other in a first direction across the array. In particular, the first direction corresponds to a crosscut perpendicular to an extension direction of the cylindrical micro-lenses. Alternatively, the micro-lens array is embodied as a periodical a-cylindrical array with e.g. a parabolic profile. In particular, the profile is of a half-sine-period or is a sine profile between $\Pi$ and $2*\Pi$.

In some embodiments of the present invention, one-dimensional (vertical) focussing of the light (laser) beam may be achieved using e.g. further cylindrical optics like a common cylindrical lens. A broad area laser output can first be collimated by an aspherical (circularly symmetric, non-cylindrical) lens aligned and mounted permanently together with the broad area laser source. It is also possible to skip the collimator and use a stronger vertical focussing lens. Due to the strong divergence of the source, it may however more practical to first collimate the light so that further components can be positioned with more space.

Alternatively, the cylindrical lens can be omitted. Instead, the vertical focus is obtained by shifting the laser collimation lens forward. This also focuses the beam in the horizontal direction, but this effect can be neglected in comparison with a following horizontal diffuser (micro-lens array).

Alternatively, the collimator and/or regular cylindrical lens may be replaced by a "fast axis collimator" (FAC) which is a very small acylindrical lens positioned close to the laser and with a high numerical aperture so as to create a perfect focus. Compared to using a circular symmetric collimator, the FAC needs to be aligned very accurately in rotation but can on the other hand be freely positioned along its length direction. One additional benefit of using an FAC is that the first horizontally spreading element is no longer required.

The beam forming assembly may further comprise one or two cylindrical lenslet arrays which substantially do not influence beam forming in vertical direction but which are positioned and aligned so that a particular beam forming in horizontal direction is enabled.

The influence on the emitted light/laser light by the cylindrical lens with respect to the horizontal direction can be neglected. However, the micro-lens array(s) affect the laser beam so that an extension of propagation (angle) in a horizontal plane is caused. The cylinder micro-lens arrays do nearly not affect the quality of the vertical focusing. In other words, the laser beam is horizontally (so called slow axis of a laser diode) diffused by interaction with the one or two micro-lens arrays.

Moreover, a respective micro-lens array can be designed so that a desired intensity distribution of the laser light across the produced laser line is provided. A micro-lens to micro-lens pitch, a height of the respective micro-lenses and respective radii of curvatures may be chosen accordingly. The light intensity then could be lowest in the centre of the laser line and highest at its both ends (e.g. of at least 10% higher). Such excessive intensities at the great diffusion angles (around the ends of the laser line) provide a precompensation of expected intensity influences (losses) in particular due to the $\cos^4$-law. This means that intensity decays towards the ends of the laser line on side of a respective receiving unit still occur, but the amount of decay basically corresponds to the amount of the initially provided superelevation in a way that a resulting intensity at the sensor comprises an intensity of basically one level.

According to an embodiment of the light emitting unit, the cylindrical micro-lenses of the cylindrical micro-lens array are arranged and designed so that a periodic profile is provided on the surface of the array in the first direction, wherein the periodic profile has a wave-like shape.

In another embodiment of the invention the profiles of the cylindrical micro-lenses of the cylindrical micro-lens array comprise at least partly circular-like shapes. Particularly, a surface profile in form of a half circle (representing a first micro-lens) is positioned next to a half hollow circle (in sense of a crosscut through a half hollow sphere), wherein the circular shapes in both directions comprise same optical and dimensional properties (e.g. radius, refractive index) but opposite curvatures. Preferably, the profile of the cylindrical micro-lens array is of a half-sine-period or of a sine profile between Π and 2*Π.

Of course, in context of the present invention, various designs of the micro-lens array which provide successive micro-lenses with alternating curvatures (regarding the direction of curvature) lie within the scope of the present invention. E.g. the profiles of the micro-lenses can be of parabolic shape or not exactly but similarly shaped like a half sine period segment.

In some embodiments, the cylindrical micro-lenses of the cylindrical micro-lens array are designed and arranged next to each other so that a sinusoidal profile is provided in the first direction on the surface.

According to some embodiments of the invention, the micro-lens array is represented by a pattern of convex and concave lenses.

Concerning the periodicity of the micro-lens array, i.e. of the surface profile, the periodic structure can comprise constant periodicity and amplitude across the array, in particular in the first direction, i.e. same pitches (distance from micro-lens to micro-lens) and heights (amplitudes) for the micro-lenses over the entire array.

Alternatively, the micro-lens array may comprise varying periodicity (pitch) and/or amplitude (heights) across the array, in particular in the first direction, depending on the desired properties of the light line. By such varying surface profile particular optical manipulation of transmitted or reflected light can be achieved.

According to an embodiment of the invention, the measuring range of a measuring system using a light line produced with a described micro-lens array would be defined at least by the design of the respective micro-lens array. Therefore, the used micro-lens array would have to be adjusted to particular measuring requirements, in particular because of optical effects becoming more or less relevant with particular distances from the lens array.

A particular measuring range with respect to a light emitting direction can be defined by periodical arrangement of the micro-lenses with a defined micro-lens to micro-lens pitch (distance from lens to lens). A maximum measuring range may depend on the Talbot length $z_t$ defined at least by the micro-lens to micro-lens pitch (and particular shapes and dimensions of the micro-lenses), in particular wherein a minimum of the measuring range corresponds to half the Talbot length $z_t/2$. Thus, the micro-lens array may preferably be designed so that a preferred measuring range lies within a region of a occurring Talbot patter which comprises no or only small-sized speckles of brightness or darkness which do not (negatively) influence the results of a possible distance measurement.

According to one embodiment, the micro-lens array is designed so that the sizes of possible speckles of the related Talbot effect for a desired measurement range are smaller than respective pixels of a sensor unit arranged for receiving reflections of the produced light line when imaged onto the sensor. In other words, the structure of the Talbot pattern in an image on the sensor is smaller than a pixel pitch.

The micro-lens to micro-lens pitch can be provided so that Talbot self-imaging of the micro-lens array in the laser line at a defined distance from the micro-lens array (e.g. within a preferred measurement range) provides a Talbot pattern with light structures as imaged onto the sensor being smaller than a pixel size of sensor arranged for imaging the laser line.

In that context, a maximum measuring range can be set by respective choice of the micro-lens array. The Talbot length $z_t$ would respectively be defined by the design of the array.

For checking if the object to be measured is located within a defined measurement range (relating to a distance between the object and the measuring device) an optical visual guide can be projected into the measuring volume. That optical guide gives information (e.g. to an operator of the system) if the object lies within a preferred measuring region (distance to the measuring device) or not. Such guide could be represented by a line of light being visually receivable and/or having e.g. particular light colour (wavelength) different from the wavelength of the measuring light. Depending on a relative position of that visual guide e.g. in a captured image the location of the object 5 with reference to the measuring range is provided. Such projection can be realised e.g. by illumination of a diffractive hologram as for instance known by the "Flexpoint DOE Series" of the company "Laser Components".

According to some embodiments of the invention, the micro-lenses are arranged with a micro-lens to micro-lens pitch in a range of 20 μm to 200 μm, in particular with a pitch of 150 μm.

In another embodiment of the light emitting unit, a topographic micro-lens height (amplitude) regarding an average surface level of the micro-lens array is of at least 5 μm, in particular between 40 μm and 50 μm.

Concerning the task of beam optimised forming the light emitting unit may—according to an embodiment if the invention—comprises a second micro-lens array arranged between the light source and the above mentioned first micro-lens array, wherein the second micro-lens array can be designed according to the micro-lens array as described, and wherein the second micro-lens array provides translation-invariant positioning of the first micro-lens array relative to the light source.

According to a further embodiment of the invention, the cylinder lens is replaced by a Fresnel cylindrical lens which is arranged to provide transition of the light emitted by the light source before reaching the micro-lens array, wherein a temporal coherence of the measuring light is diminished by interaction of the light with the Fresnel cylindrical lens.

Regarding the used light source, the light source can preferably be designed so that the measuring light is producible with a spatial coherence in a first (vertical) direction and incoherent regarding a second (horizontal) direction, in particular wherein the light source may be designed so that the measuring light is producible comprising one spatial ground mode regarding the first direction and more than one spatial modes (several transversal modes) regarding the second direction.

More specifically, the light source can be represented by a light-emitting diode (LED), in particular comprising a spatial filter, in particular a masking with a slit. Alternatively, the light source can comprise or is designed as a laser source, wherein the emitted light is provided as laser light and the light beam is a laser beam, in particular as a broad area laser (BAL), a super-luminescent diode (SLED) or a multi-mode laser source.

In case the light source comprises a light-emitting diode or laser source, the light source may further comprise a collimation element having an asymmetric light-emitting aperture, wherein the collimation element is designed so that a length of the light-emitting aperture in the first direction is significantly smaller than in the second direction.

Some embodiments of the present invention relate to a triangulation-based distance measuring device comprising a light emitting unit with a light source for providing measuring light in form of a light line with defined intensity distribution across the line, a light receiving unit having a sensor for detecting measuring light reflected and received from an object to be measured and a controlling and processing unit for deriving distance information based on the detected reflection. The light emitting unit and the light detection unit are arranged with known spatial position and orientation relative to each other, in particular according to the Scheimpflug criterion.

The light emitting unit of the triangulation-based distance measuring device comprises at least one micro-lens array, wherein the at least one micro-lens array comprises a plurality of micro-lenses, wherein the micro-lenses are designed and arranged in joint manner next to each other with algebraic signs for curvatures of successive micro-lenses being opposite (alternating) and so that a periodic structure is provided, wherein periodicity is defined by at least two successive micro-lenses with opposite curvatures.

According to an embodiment of the triangulation-based distance measuring device, the micro-lenses are arranged with defined micro-lens to micro-lens pitch, wherein the pitch as imaged onto the CMOS or CCD sensor is equal to or smaller than a pixel size of the sensor, in particular wherein the pitch as imaged onto the CMOS or CCD sensor is equal to or smaller than a pixel size of the sensor.

Hence, the (structural) micro-lens pitch itself does not have to be smaller than the pixel pitch but the image of the micro-lens pitch which is obtained by the (CCD or CMOS) sensor should be smaller than the pixel pitch.

By satisfying that criterion, the self-image pattern emerging due to the Talbot effect comprises speckles which when imaged onto the sensor mainly are smaller regarding their sizes than the pixel size. As a result, the pattern produced on the object to be measured can be detected in very precise and accurate manner leading to significant improvements with view to triangulation distance measurements.

BRIEF DESCRIPTION OF THE FIGURES

Devices according to the invention are described or explained in more detail below, purely by way of example, with reference to working examples shown schematically in the drawings. Specifically.

FIG. 10 shows a working principle of a triangulation device the present invention relates to.

DETAILED DESCRIPTION

Figure 1A:
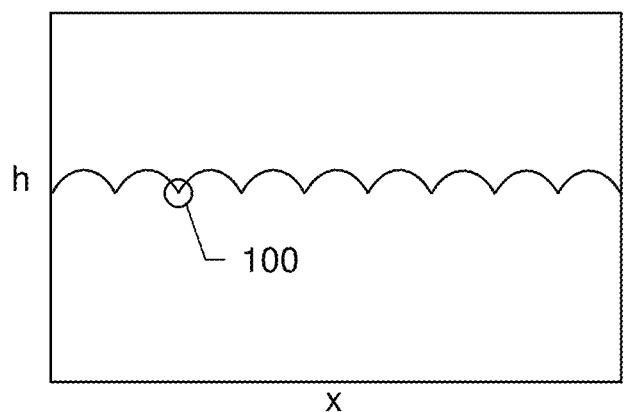
FIGS. 1a-b show a crosscut and a top view of a micro-lens array according to prior art.
Figure 1B:
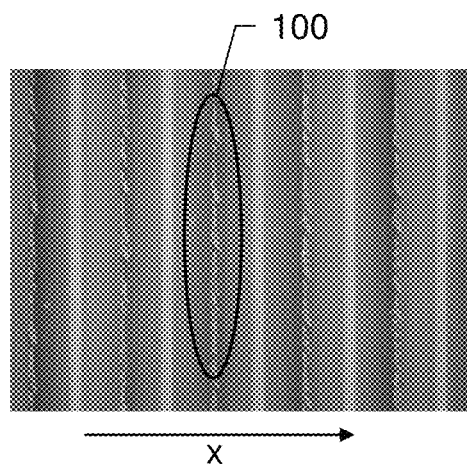
Figure 2:
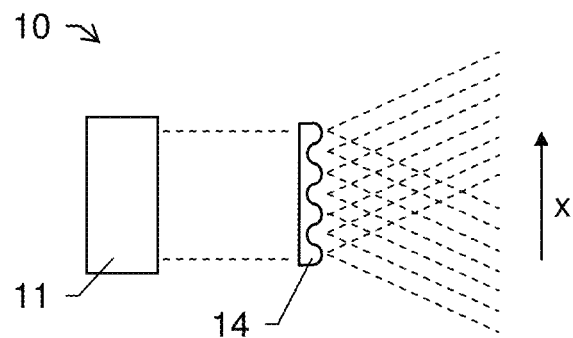
FIG. 2 shows an embodiment of a light emitting unit according to the invention.

FIG. 2 shows a light emitting 10 unit according to the invention. The light emitting unit 10 comprises a light source 11 and a micro-lens array 14. The light source 11 here may be designed as a light emitting diode (LED), a laser diode or a broad area laser (BAL) (e.g. with a collimation lens) or any other kind of suitable light source.

Broad area lasers (BAL), also known as "broad stripe", "slab" or "broad emitter" laser diodes have a gain volume which is much wider in one lateral direction (x-direction). Compared to single-mode laser diodes which have gain regions which are small in both directions, a BAL emits a very high optical power (in the order of 1-10 W). A BAL can be used in pulsed mode with pulses typically below 100 ns, but in some cases also with longer pulses or even in continuous mode In the wide direction, many spatial modes as well as longitudinal modes can coexist. In a narrow direction, preferably only one spatial ground mode propagates, and the laser can thus be focused down to a diffraction limited line focus. Furthermore, BALs are low cost and represent a suitable type of light source for this invention.

Alternatively, a light source may be used with very small extent as to the vertical direction or comprising an additional optical element which provides a corresponding small extent (e.g. a LED masked by a very thin slit).

Using an arrangement of the light source 11 and the micro-lens array 14 as shown provides for diffusion (spreading) of the light emitted by the light source 11 in one direction so that a line of light is provided as measuring light for triangulation measurement of an object. The optical element 14 provides a specific diffusing angle of the measuring light, here of about ±27°, i.e. an overall opening angle of about 54°.

Furthermore, the array of lenses 14 and the light source 11 are preferably designed and arranged so that the measuring beam is emittable in form of a basically continuous line regarding its extension in the wide direction (x-direction). For that, the pitch of the lens array 14 and the width of the laser diode can be chosen so that the projected diode width matches the diffraction angle of the lens array 14 and the emitted line thus becomes continuous without any dark spots which could otherwise occur if the lens array pitch is too fine or the laser width too small. A too coarse array pitch or wide laser could on the other hand cause bright spots where two projections overlap, so it is optimal to choose these parameters exactly so that there is no overlap, or multiples of 100% overlap.

According to a specific embodiment, the configuration comprises one micro-lens array 14 in combination with a 10 mm exit aperture.

In particular, prior to final diffusion by the micro-lens array 14, the light beam, in particular laser beam, is made "wide enough" to provide a large emitting surface. The initial width of the emitted (and collimated) beam may for instance be about 1 mm while after widening it may be 10 mm at the diffuser 14 (lens array). Several types of components can be used to widen the emitted beam, e.g. a further cylindrical lens, a lenslet array, a diffractive optical element, a Fresnel lens or some kind of computer generated or natural hologram. A further lenslet array may represent such beam spreading element, wherein the shown lenslet array 14 represents the beam diffusing element. If the source is a laser without collimation in a horizontal direction (slow axis), the beam may diverge fast enough that no extra optics is needed.

Concerning the used light or laser diode and a possible focussing collimator, these may comprise asymmetric aperture. The aperture particularly is designed to be as large as possible along the line (to enhance efficiency), i.e. in a horizontal direction (slow axis), and additionally narrower across the line to increase and define depth of focus, as well as to improve focus quality. With a smaller NA it is possible to use a cheaper lens. Moreover, it is difficult to achieve a large depth of focus with only one lens without aperture since it would have to have a very short focal length. A lens with longer focal length with aperture improves pointing stability since magnification from laser position to beam angle is smaller. Since the aperture costs some (e.g. 60%) efficiency, it is beneficial to have a high power laser diode like a BAL.

The micro-lens array 14 comprises a number of micro-lenses arranged next to each other, wherein successive micro-lenses have opposite directions of curvature, i.e. the sign or curvature is alternating from micro-lens to micro-lens. Hence, a wave-like surface profile is provided by that particular arrangement of lenses.

Concave and convex like shaped lenses are alternating along a line across the lens array 14, in particular along the x-direction.

By such arrangement of the micro-lenses a periodic structure is provided, which is free of optical irregularities on the surface (burrs, soiling, residues by manufacturing etc.). The amount of such irregularities is at least strongly reduced or avoided due to homogenous transition areas in the contact region of two successive micro-lenses.

Figure 3:
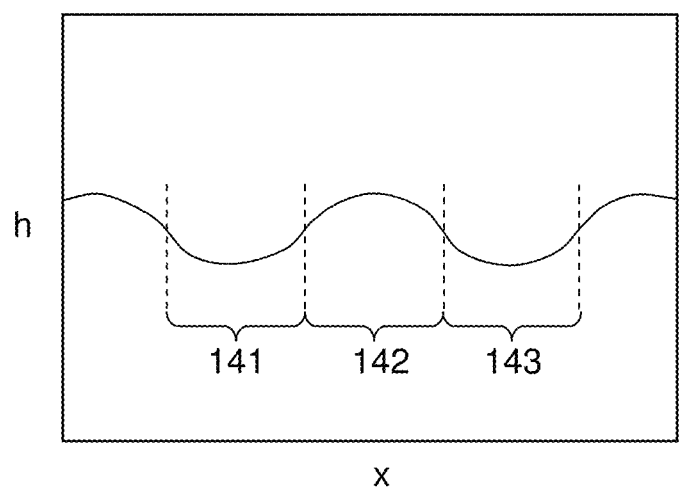
FIG. 3 shows a profile of a micro-lens array of a light emitting unit according to the invention.

FIG. 3 shows a profile of a micro-lens array of a light emitting unit according to the invention. Such profile represents the shapes of successively arranged micro-lenses 141,142,143. As can be seen the lenses 141 and 143 have curvatures of identical directions (identical signs), wherein the lens 142 in-between has a curvature with opposite sign. The signs of curvature from micro-lens to micro-lens change in the contacting points (depicted by the dashed lines) of two successive lenses.

Of course, it is to be understood that FIG. 3 shows only a comparatively small part of an entire micro-lens array. The structure further extends periodically at least in x-direction.

Periodicity on the surface of the array is given by successively repeating sets of two lenses with opposite signs of curvature.

The shape of the profile along the x-direction can also be described more general mathematically. The profile as shown represents a profile height (h) across a lateral position (x) on the surface. A function of the profile height and the slope of the profile in x direction (=the first derivation of the profile function) can be continuous functions without any jump discontinuities.

For instance, the function of a profile height (h) according to one specific embodiment of the invention is $$h = \frac{\frac{x^2}{R_0}}{1 + \sqrt{1 - (1+k)\frac{x^2}{R_0^2}}},$$

wherein $R_0$ is the radius of curvature and k is the conical constant.

In particular, the radius of curvature is out of a range between 9 μm and 20 μm and the conical constant ranges between −1.5 and −1.1. Using such parameters, the pitches from micro-lens to micro-lens result between 20 μm and 40 μm and a preferred lens height between 5 μm and 10 μm.

According to an embodiment of the invention the micro-lens array may comprise at least 150 pairs of micro-lenses, preferably more than 180 pairs, in particular wherein the lenses are cylindrical lenses.

Figure 4:
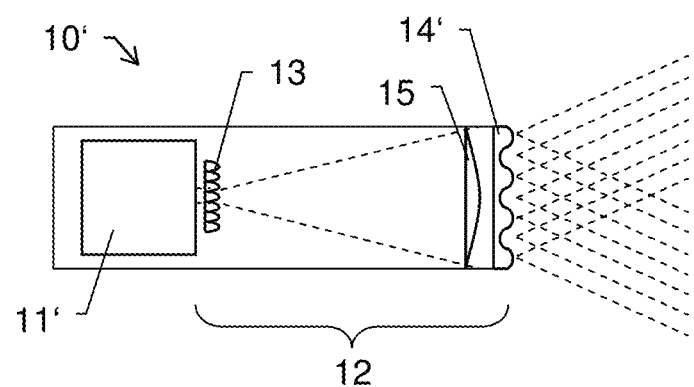
FIG. 4 shows an embodiment of a light emitting unit according to the invention.

FIG. 4 shows an embodiment of a light emitting unit 10' according to the invention. The unit 10' comprises a light source 11' and a beam forming assembly 12. The light source 11' may be designed as a light emitting diode (LED), a laser diode or a broad area laser (BAL) (and a collimation lens) or any other kind of suitable light source.

The beam forming assembly 12 comprises a cylindrical lens 15 and two lenslet arrays 13,14' (micro-lens arrays), wherein at least one of which comprises successively arranged micro-lenses with alternating signs of curvature (here shown with the micro-lens array 14'). Using an arrangement of optical elements 13-15 as shown provides for diffusion (spreading) of the light emitted by the light source 11' so that a line of light is provided as measuring light for triangulation measurement of an object. The optical elements 13-15 provide a specific diffusing angle of the measuring light.

The cylindrical lens 15 preferably has a focal length essentially equal to the distance to lenslet array 13.

Focussing in the vertical plane is basically provided by the design of the laser source 11'.

It is beneficial to use cylindrical lens arrays 13 e.g. instead of single-surface large lenses since the tolerance on lateral positioning is much less strict. Having two diffusers (e.g. the two lenslet arrays 13,14' as shown) also reduces speckle by in effect converting several transversal modes to spatial incoherence. The first diffuser (which spreads the light to cover the second one) could have a pitch at least around five times smaller than the beam width to reduce effects of lateral positioning.

Furthermore, the array of cylindrical lenses and the light source are preferably designed and arranged so that the measuring beam is emittable in form of a basically continuous line regarding its extension in the second direction. For that, the pitch of the first cylindrical lens array 13, the width of the laser diode and a laser collimation lens focal length can be chosen so that the projected diode width matches the diffraction angle of the lens array and the emitted line thus becomes continuous without any dark spots which could otherwise occur if the lens array pitch is too fine, the laser width too small or the collimator focal length too long. A too coarse array pitch, wide laser or short collimator focal length could on the other hand cause bright spots where two projections overlap, so it is optimal to choose these parameters exactly so that there is no overlap, or multiples of 100% overlap.

The light emitting unit 10 as shown may provide a light line with a particular intensity distribution concerning the emitted light. Such distribution is provided by respective diffraction and collimation effects of the optical elements 13-15. The intensity may be lowest in the middle of the produced line. The light intensity (brightness) then increases towards the ends of the light line. The increase may particularly correspond to a growth of intensity according to a factor $$\frac{1}{\cos^4(\alpha)},$$

wherein α represents a respective diffusion angle, i.e. the distance along the light line from the midpoint to a respective end. a is limited by the diffusion angle defined by the optical elements, e.g. finally by the cylindrical micro-lens array 14'.

As mentioned, also the lens array 14' is embodied as a cylindrical micro-lens array 14' which comprises multiple cylindrical micro-lenses arranges next to each other so that neighbouring lenses comprise inverted curvatures. Besides the opposite curvature of to successive lenses other (optical) properties, like e.g. focal lengths, may be identical.

The micro-lens array 13 may also be embodied as a cylindrical lens array comprising alternating curvatures of successive lenses (not shown).

Figure 5A:
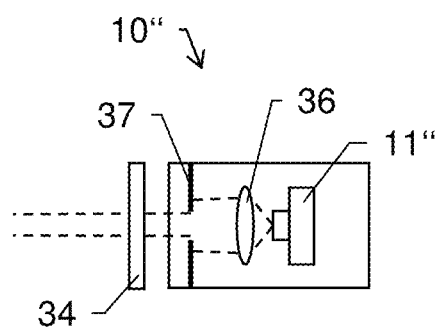
FIGS. 5a-b show a further embodiment of a light emitting unit respectively the light source according to the invention from different perspectives.
Figure 5B:
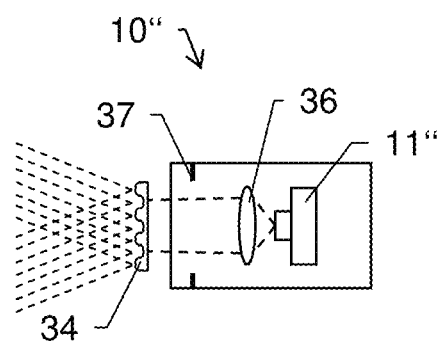

FIGS. 5a and 5b show a further embodiment of a light emitting unit 10'' respectively the light source 11'' according to the invention from different perspectives. The optical elements 36 and 37 as shown may be directly and fixed arranged with the light source 11'', wherein the light source may be understood as a laser source already being equipped with such components. FIG. 5a shows the laser source and a micro-lens array 34 with lenses of alternating signs of curvature in side view. The light emitting unit 10'' comprises a laser diode 11'' and a (collimation) lens 36. In addition, the light emitting unit 10'' comprises an aperture 37 of asymmetric shape. As can be seen in side view, the element 37 comprises comparatively small aperture, e.g. a quite narrow slit for light transmission, for providing large depth of focussing in the first (vertical) direction. Such collimation element 37 further provides a large aperture in the second direction reduce losses for diffusion in the horizontal plane (FIG. 5b). As collimation and spatial limitation of the laser beam with respect to the vertical direction can so be provided in sufficient manner, no further cylindrical lens for focusing is needed.

The focussing of the laser light in the vertical direction and diffusing in the horizontal direction leads to reduction of subjective speckles formation while providing a well defined line which is very suitable for triangulation measurements. Apart from lowering speckle noise and thus improving depth accuracy, the low-speckle illuminator also allows a much increased camera depth of field. The reason for this is that the speckle contrast no longer depends on the camera NA as it does with a fully coherent source.

In addition, relating to detection of the produced laser beam, specific camera optics may be provided with the image sensor. The camera optics may comprise a camera lens which may also have asymmetric aperture since optical resolution along line (horizontally) may be more critical than across. This also results in realising reduced exposure time and thus improves eye safety. Such camera lens may be anamorphic (different magnifications regarding the first and the second direction) to e.g. obtain a wider field of view. Preferably, the camera comprises an intensity filter to provided proper filtering of incoming light.

Due to the design of the lens array 34—and in particular of the laser source 11'', the lens 36 and the aperture 37—intensity distribution of a line emittable with such arrangement may be adjusted having significantly greater intensities at its ends than in the centre of the line. In particular, intensity increase along the line is proportional to a factor $$\frac{1}{\cos^4(\alpha)} \text{ or } \frac{1}{\cos^5(\alpha)}.$$

Figure 6:
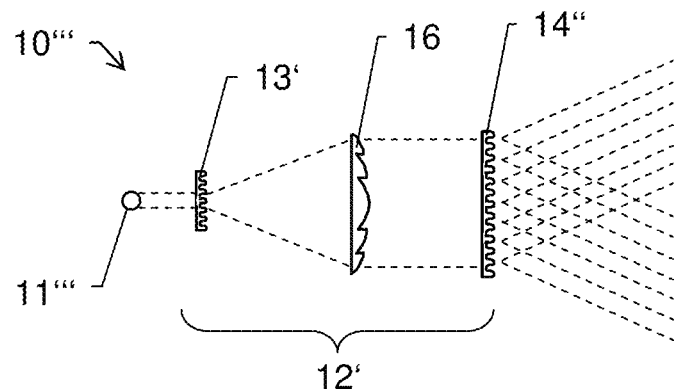
FIG. 6 shows a further embodiment of a light emitting unit having a Fresnel lens according to the invention.

FIG. 6 shows a further embodiment of a light emitting unit 10''' according to the invention.

The unit 10''' comprises a light source 11'' and a beam forming assembly 12'. The light source 11'' may e.g. be designed as a broad area laser (BAL).

The beam forming assembly 12' comprises a cylindrical Fresnel lens 16 and two lenslet arrays 13',14'' (cylindrical micro-lens arrays), wherein at least one of the arrays comprises successively arranged micro-lenses with alternating signs of curvature (here shown for both arrays). Using an arrangement of optical elements (13',14'',16) as shown provides for diffusion (spreading) of the light emitted by the light source 11'' so that a line of light is provided as measuring light for triangulation measurement of an object. The optical elements provide a specific diffusing angle of the measuring light of about 23°.

The Fresnel cylindrical lens 16 is arranged for reducing or avoiding the generation of a Talbot pattern (see FIG. 8 and description below) at the object to be measured and consequently on a camera sensor for capturing an image of the object. The lens 16 introduces several phase shifts of at least 2Π between different beam parts that add-up incoherently after passing the micro-lens array 14'' in the measurement field. Preferably the optical path length difference is beyond the coherence length of the light source.

For instance by use of a first lens array 13' with an diffusing angle of about 30° and a diffusion angle of about 23° of the second array 14'' an optical path difference of 1.5 mm can be realised. Thus, temporal coherence of the laser light emitted with the light emitting unit 10''' is reduced or removed.

Having light emitted with lower coherence the occurrence of a Talbot pattern is reduced simultaneously. Hence, the generation of a so caused Talbot pattern along the laser line is getting less probable and surface measurements with such laser line becomes more precise and reliable.

According to a further embodiment of the invention, the Fresnel lens can be combined with the second micro-lens array into a single micro-optical component by addition of the corresponding optical phase modulation functions. To avoid excessive phase jumps and acute angles produced by traditional modulo-2Π wrapping, the wrapping algorithm can be optimized by shifting phase jumps left or right as to minimize the number of jumps and maximize the obtuseness of the edges on each side of each phase jump. This will come at the cost of a slightly increase total phase range, but greatly improves the manufacturability and resulting quality of the microstructure. In effect, this optimisation method will shift the jumps (i.e. Fresnel zone boundaries) to integer multiples of the micro-lens pitch.

Figure 7A:
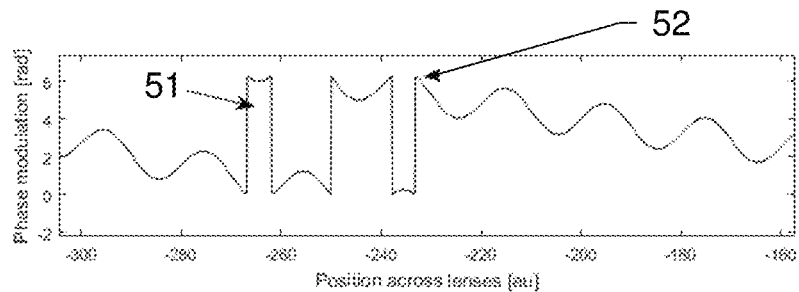
FIGS. 7a-b show a traditional wrapping and a optimised wrapping resulting from a combination of a Fresnel lens and a micro-lens array.
Figure 7B:
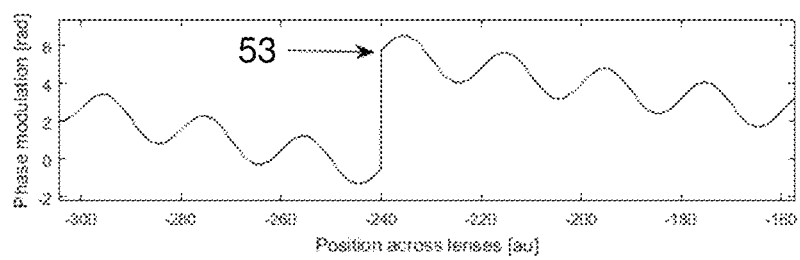

Such optimisation is shown with FIGS. 7a and 7b. FIG. 7a shows a traditionally occurring modulo-(2Π) wrapping comprising unwanted jumps 51 to be avoided and an acute angle 52. FIG. 7b shows the resulting wrapping with a desired obtuse angle 53 after having combined and adjusted a Fresnel lens and a micro-lens array as described.

Alternatively, keeping the Fresnel zones intact, one could adapt the micro-lens pitch for each zone to also achieve obtuse angles at the phase jump. The micro-lens height should then also be adapted to maintain the same angular spectrum.

In the case of very strong Fresnel lenses, the phase jump can be multiples of 2Π. Also in this case the same principle can be utilized to adapt the jump position to the micro-lenses or vice versa.

According to a further embodiment, one or more additional (a-) cylindrical micro-lens array is positioned along the beam as to reduce the coherence further.

According to a further embodiment, a second micro-lens array is designed to produce a line at an offset angle (e.g. 45±20 degrees). Unlike for angle=0 (on-axis) where the path length difference is very small, at such large angles the path length differences between the left and right end of the array are significant and objective speckles (Talbot pattern) are hence significantly reduced. At the cost of power, the angularly offset line could also be obtained by masking an on-axis centred line. Alternatively, the beam from an on-axis line laser could be made off-axis by adding a blazed grating before or after the last micro-lens array.

Figure 8:
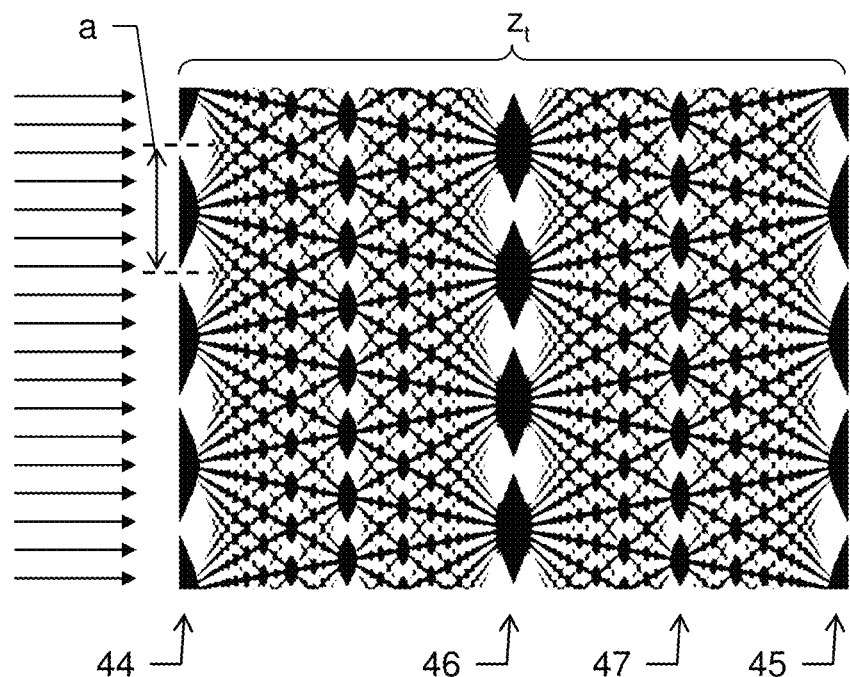
FIG. 8 shows a Talbot pattern which emerges by illumination of a periodical structure like a (cylindrical) micro-lens array according to the invention.

FIG. 8 shows a Talbot pattern (or "Talbot carpet") which emerges by illumination of a periodical structure 44 like a (cylindrical) micro-lens array.

The optical Talbot effect here is shown for monochromatic light. On the left of the figure the light can be seen diffracting through the lens array 44, wherein this exact pattern is reproduced 45 on the right of the picture in a defined distance away from the structural pattern (one Talbot length $z_t$ away from the array). Halfway between each edge and the middle (=secondary Talbot image 46), one sees the image shifted to the side (double-frequency 47 fractional image). Moreover, at regular fractions of the Talbot length sub-images are clearly seen. The Talbot length is defined by $$z_t = \frac{2a^2}{\lambda},$$

wherein a is the pitch between two successive micro-lenses.

This pattern is repeated with period $z_t$ in distance z until the diffraction orders separate. It also extends up and down (along the laser line), but may be weaker further away from the centre due to longitudinal incoherence.

With view to triangulation measurements results of respective distance measurements would become inaccurate in case a light line is detected which contains bright and dark regions of relatively large size compared to a pixel size of a detecting sensor unit. Therefore, in order to provide accurate measurements there are some possible approaches working around said problem.

First, choose such a small period of micro-lenses so that the size of the occurring Talbot pattern is not of big problem. In particular, a lens-to-lens period is chosen which is smaller than a pixel resolution of camera in a respective triangulation sensor, e.g. smaller than 50 μm.

Alternatively, choose a large period and adjust working range to fit between $z_t$ and $z_t/2$. As occurring patterns in the sub-images are comparatively small, they would not negatively influence accuracy of measurements in a significant way. However, as even double-frequency Talbot effects can be larger than camera pixel resolution respective design of the micro-lens array may have to be chosen as well.

A further reduction of the Talbot effect can be achieved by reducing the coherence of the light. Using a Fresnel cylindrical lens one introduces several phase shifts of at least 2Π between different beam parts that add-up incoherently after passing the micro-lens array in the measurement field. Preferably the optical path length difference is beyond the coherence length of the light source.

According to a further embodiment of the invention (not shown) several Fresnel lenses might be used in a kind of optical relay setup (alternating collimation and focussing) to further increase the path length difference between different beam parts to reduce the Talbot-effect.

In case the arranged cylindrical lens consist of a diffractive lens like a Fresnel-lens the profile of the micro-lens array might be added (addition of phase profiles) to generate a new combined diffractive element providing the optical response of the cylindrical lens and of the micro-lens array in one part and in one diffractive structure.

Moreover, by driving the light source (laser diode) in a very short pulse mode at a high pulse repetition rate preferably with a pulse width of a few nanoseconds the emitted spectrum will be broadened because many longitudinal modes start to oscillate similar to an SLED device. This effect will also reduce the temporal coherence of the light source and by this will diminish the visibility of the Talbot-effect in the measurement range.

According to a related embodiment of the invention, the light source is embodied to be driven in a pulsed mode in such way that pulses with pulse durations of nanoseconds are provided on operation of the light emitting unit.

Figure 9:
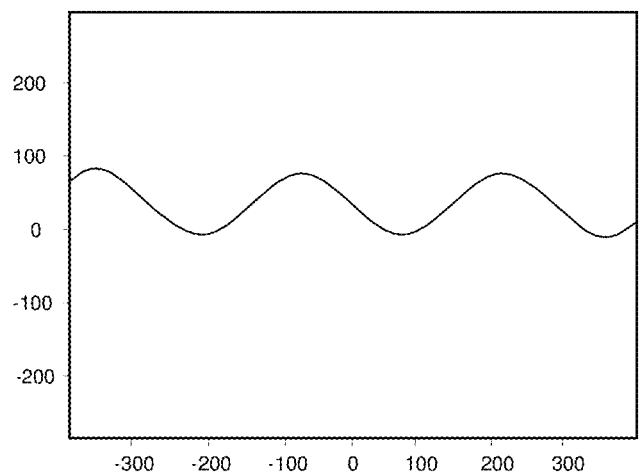
FIG. 9 shows a surface measurement of an embodiment of a micro-lens array according to the invention.

FIG. 9 shows a surface measurement of an embodiment of a micro-lens array according to the invention. The design of such micro-lens array is sinusoidal meaning a periodic pattern of convex and concave acylindrical lenses. The chart shows a measured height in micrometers over respective lateral positions the measurements are taken (in micrometers as well). As can be seen, according to the shown embodiment the height between the lowest points and the highest points in the profile is in a range of 70 to 90 μm.

Of course, according to alternative embodiments of the micro-lens array (not shown) there might be different heights and/or distances from lens to lens. E.g. the lenses may be provided with alternating radius sign between 7 μm and 18 μm, i.e. with heights of about 15 μm to 36 μm.

According to a further embodiment of the invention (not shown) the cross section of the cylindrical micro-lens array may be in form of curvature-alternating parts of spheres. In particular, half-spheres are arranged next to each other with opposite curvatures (e.g. convex and concave in turns).

Figure 10:
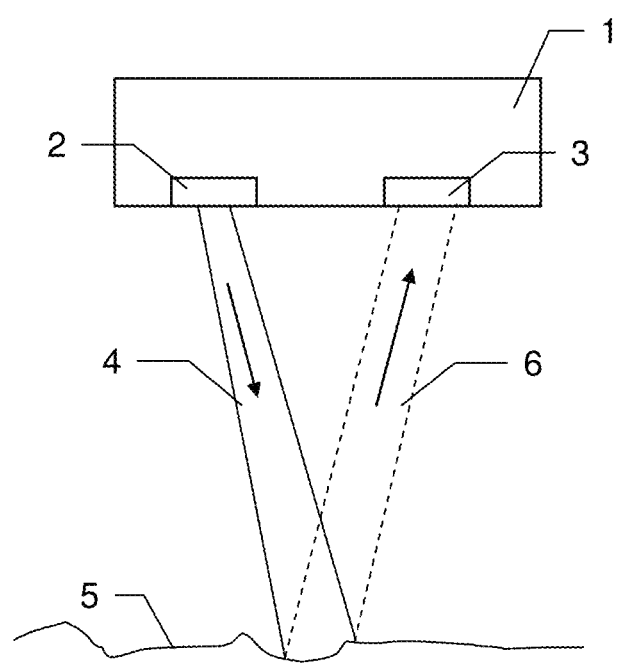

FIG. 10 shows the working principle of a triangulation device 1 according to the invention. The device 1 comprises a light emitting unit 2 and a light receiving unit 3, e.g. a camera, the relative positions and orientations of which are known. In other words, such laser triangulation is to send out light in one known direction from a known position and receive from a known position and measure the angle of the incoming light.

The light emitting unit 2 comprises a light source which may be represented by a laser diode for emitting laser light. Furthermore, the light emitting unit comprises an optical unit for forming the emitted laser light so that a defined measuring beam 4 can be emitted. Such measuring beam is focussed according to a first direction (vertically) and diffused with respect to a second direction (horizontally), orthogonal to the first direction. By doing so, a laser line can be produced and projected onto an object 5 to be measured.

The light receiving or detecting unit 3 comprises an optical assembly (e.g. imaging lens) as well to form and direct the reflected light 6 to an image sensor of that unit. The sensor preferably is designed as a CCD or CMOS sensor providing a pixel-array in form of a line or an area. The sensor is also preferably tilted according to the Scheimpflug criterion so that camera's object plane coincides with the illuminated plane so that all illuminated points are imaged sharply onto the sensor. The image sensor is designed being at least sensitive for light of a wavelength of the measuring light 5. The pixels of the image sensor are exposed by the incoming reflected light 6 and a course of the line at the object 5 can be derived based on the illuminated pixels of the sensor. That allows determining distances to the object's surface based on the knowledge of the relative positions of emitter 2 and detector 3 and the detected line, in particular based additionally on the properties of the optical assembly and the position of the detected line on the image sensor.

According to an alternative embodiment not shown here, the emitted beam 4 is emitted in a direction perpendicular to the housing, allowing to place an additional receiving unit at the left side of the emitting unit 2 in order to generate additional measuring data. There also can be arranged a third receiving unit 3 placed beside the emitting unit 2 at the same distance than the first one (and/or second one) or at different distances to achieve a higher robustness against the detection of objects with a strong contrast change (introducing a shift of the detected intensity centroid) or the detection of edges causing shadowing effects.

By moving the triangulation device 1 over the object 5, continuously receiving the reflected light 6 and processing signals provided by the image sensor, the surface of the object 5 can be measured in its entirety. In particular, such scanning is performed by a coordinate measuring machine (either motorized or hand-held) carrying the triangulation device 1 and moving it along a desired measuring path.

According to the invention, the light emitting unit 2 comprises a micro-lens array having alternating curvatures of successively arranged micro-lenses, e.g. according to any embodiment of a respective micro-lens array described herein above in context with the invention.

Although the invention is illustrated above, partly with reference to some specific embodiments, it must be understood that numerous modifications and combinations of different features of the embodiments can be made and that the different features can be combined with each other or with triangulation principles and/or coordinate measuring machines known from prior art.

What is claimed is:

1. A triangulation-based distance measuring device comprising:
    a light emitting unit comprising a light source for providing measuring light in a form of a light line with defined intensity distribution across the line,
    a light receiving unit having a sensor for detecting measuring light reflected and received from an object to be measured; and
    a controlling and processing unit for deriving distance information based on the detected reflection,
    wherein the light emitting unit and the light detection unit are arranged with known spatial position and orientation relative to each other according to the Scheimpflug criterion,
    wherein:
        the light emitting unit comprises at least one micro-lens array that comprises a plurality of micro-lenses, wherein the micro-lenses are designed and arranged in joint manner next to each other
        with algebraic signs for curvatures of successive micro-lenses being opposite, and
        so that a periodic structure is provided, wherein periodicity is defined by at least two successive micro-lenses with opposite curvatures.

2. The triangulation-based distance measuring device according to claim 1, wherein
    the micro-lens array is a cylindrical micro-lens array having a plurality of cylindrical micro-lenses as micro-lenses arranged next to each other in a first direction across the array, in particular wherein the first direction corresponds to a crosscut perpendicular to an extension direction of the cylindrical micro-lenses.

3. The triangulation-based distance measuring device according to claim 2, wherein
    the cylindrical micro-lenses of the cylindrical micro-lens array are arranged and designed so that a periodic profile is provided on the surface of the array in the first direction, wherein the periodic profile has a wave-like shape.

4. The triangulation-based distance measuring device according to claim 2, wherein the profiles of the cylindrical micro-lenses of the cylindrical micro-lens array comprise at least partly circle-like shapes.

5. The triangulation-based distance measuring device according to claim 2, wherein
    the cylindrical micro-lenses of the cylindrical micro-lens array are designed and arranged next to each other so that a sinusoidal profile is provided in the first direction on the surface.

6. The triangulation-based distance measuring device according to claim 1, wherein
    the periodic structure comprises constant periodicity and amplitude across the array.

7. The triangulation-based distance measuring device according to claim 1, wherein
    the periodic structure comprises varying periodicity and/or amplitude across the array in depending on the desired properties of the light line.

8. The triangulation-based distance measuring device according to claim 1, wherein
    the periodic structure comprises varying periodicity and/or amplitude in the first direction, depending on the desired properties of the light line.

9. The triangulation-based distance measuring device according to claim 1, wherein
    a particular measuring range with respect to a light emitting direction is defined by periodical arrangement of the micro-lenses with a defined micro-lens to micro-lens pitch, wherein a maximum measuring range depends on the Talbot length defined at least by the micro-lens to micro-lens pitch, in particular wherein a minimum of the measuring range corresponds to half the Talbot length.

10. The triangulation-based distance measuring device according to claim 1, wherein
    the micro-lenses are arranged with a micro-lens to micro-lens pitch in a range of 20 μm to 200 μm.

11. The triangulation-based distance measuring device according to claim 1, wherein
    the micro-lenses are arranged with a micro-lens to micro-lens pitch of 150 μm.

12. The triangulation-based distance measuring device according to claim 1, wherein
a topographic micro-lens height regarding a surface of the micro-lens array is of at least 5 μm.

13. The triangulation-based distance measuring device according to claim 1, wherein
a topographic micro-lens height regarding a surface of the micro-lens array is between 40 μm and 50 μm.

14. The triangulation-based distance measuring device according to claim 1, wherein
the micro-lens to micro-lens pitch is provided so that self-imaging of the micro-lens array in the laser line at a defined distance from the micro-lens array provides a Talbot pattern with light structures which when imaged onto an image sensor arranged for triangulation imaging the laser line are smaller than the pixel size of the sensor.

15. The triangulation-based distance measuring device according to claim 1, wherein
the light source is embodied to be driven in a pulsed mode in such way that pulses with pulse durations of nanoseconds are provided on operation of the light emitting unit.

16. The triangulation-based distance measuring device according to claim 1, wherein the micro-lens array is represented by a pattern of convex and concave lenses.

17. The triangulation-based distance measuring device according to claim 1, wherein the light emitting unit comprises
a further micro-lens array arranged between the light source and the micro-lens array is designed according to a micro-lens array of claim 1, the further micro-lens array provides translation-invariant positioning of the micro-lens array relative to the light source arranged to provide transition of the light emitted by the light source before reaching the micro-lens array is diminished by interaction of the light with the Fresnel cylindrical lens,
wherein the light source comprises:
a light-emitting diode, in particular comprising a spatial filter, in particular a masking with a slit, or by
a laser source, wherein the emitted light is provided as laser light and the light beam is a laser beam,
wherein
the light source further comprises a collimation element having asymmetric light-emitting aperture, wherein the collimation element is designed so that a length of the light-emitting aperture in the first direction is significantly greater than in a second direction.

18. The triangulation-based distance measuring device according to claim 1, wherein the light source comprises a super-luminescent diode, or a multi-mode laser source.

19. The triangulation-based distance measuring device according to claim 1, wherein
the micro-lenses are arranged with defined micro-lens to micro-lens pitch, wherein the pitch as imaged onto the sensor is equal to or smaller than a pixel size of the sensor, in particular wherein the pitch as imaged onto the sensor is equal to or smaller than a pixel size of the sensor.

* * * * *